(12) United States Patent
Hata

(10) Patent No.: US 7,123,041 B2
(45) Date of Patent: Oct. 17, 2006

(54) LSI INSPECTION METHOD AND DEFECT INSPECTION DATA ANALYSIS APPARATUS

(75) Inventor: Yoji Hata, Tateyama (JP)

(73) Assignee: UMC Japan, Tateyama (JP)

( * ) Notice: Subject to any disclaimer, the term of this patent is extended or adjusted under 35 U.S.C. 154(b) by 278 days.

(21) Appl. No.: 10/809,322

(22) Filed: Mar. 26, 2004

(65) Prior Publication Data

US 2004/0203179 A1 Oct. 14, 2004

(51) Int. Cl.
*G01R 31/26* (2006.01)

(52) U.S. Cl. ..................... 324/765; 324/158.1

(58) Field of Classification Search ............. None
See application file for complete search history.

(56) References Cited

U.S. PATENT DOCUMENTS

| 5,391,985 | A | * | 2/1995 | Henley ............... 324/158.1 |
| 6,087,673 | A | * | 7/2000 | Shishido et al. ...... 250/559.45 |
| 2003/0007677 | A1 | * | 1/2003 | Hiroi et al. ............ 382/149 |

* cited by examiner

Primary Examiner—Ha Tran Nguyen
Assistant Examiner—Russell M. Kobert
(74) Attorney, Agent, or Firm—Crowell & Moring LLP

(57) ABSTRACT

The present invention provides an LSI inspection method and a defect inspection data analysis apparatus capable of shortening a time needed for a wafer test. In a first database 11 is stored inspection data obtained when each defect inspection apparatus 20 inspects a wafer for defects in the front-end process. In a second database 12 are stored non-conforming article judgment criteria for each predetermined type of defect, according to which a non-conforming chip is judged. A defective chip identifying portion 16 identifies a chip having a defect and identifies the type of defect for each defect that the identified chip has, on the basis of the inspection data. For each identified chip, a non-conforming chip judging portion 17 judges whether the chip is a non-conforming article or not according to the non-conforming article judgment criteria corresponding to the type of defect for each defect, and obtains position information within the wafer surface of a chip judged as being a non-conforming article. The position information thus obtained is transmitted to an LSI inspection apparatus 30 via a transmission portion 15.

3 Claims, 4 Drawing Sheets

LSI INSPECTION METHOD AND DEFECT INSPECTION DATA ANALYSIS APPARATUS

BACKGROUND OF THE INVENTION

1. Field of the Invention

The present invention relates to a large-scale integrated circuit (LSI) inspection method and a defect inspection data analysis apparatus for judging whether a semiconductor device (chip), such as an LSI, formed on a wafer is a conforming or non-conforming article.

2. Description of Related Art

FIG. 4 is a view used to explain the flow of an inspection process by a conventional LSI inspection method. Initially, as shown in FIG. 4, a defect inspection is performed on a wafer each time processing is completed in each of predetermined process steps among a plurality of process steps in the front-end process. The defect inspections are performed to judge whether semiconductor manufacturing equipment that performs processing in the process steps is operating normally or not. For example, upon judgment that a number of foreign substances or the like are adhering onto a wafer, the semiconductor manufacturing equipment is suspended and an inspection, cleaning, etc. thereof are performed.

When a wafer is completed upon completion of the front-end process, a wafer test is run subsequently. As shown in FIG. 4, the wafer test includes an element parameter measurement test, a wafer B/I (Burn-In) test, and an electric property test (see, for example, Patent Document 1). In the element parameter measurement test, basic parameters of an element are measured to confirm that an element having desired properties has been formed. Normally, several elements are selected from a clearance (scribe region) between particular chips, and this test is run only on the selected elements.

The wafer B/I (Burn-In) test is run to ensure the reliability of each chip by accelerating deterioration of potential defects with application of electrical or thermal stress to the wafer in making a chip having such a potential defect completely defective. Also, the electric property test is a test by which an electric property of each chip formed on the wafer is tested to judge whether each chip is defective or non-defective on the basis of the test result.

In a case where the product is sold in the form of a wafer, the wafer is delivered after the wafer test is completed, together with a wafer map indicating the judging result as to whether each chip is a conforming or non-conforming article.

Herein, a published Japanese translation of PCT International Application No. 2001-526833 is cited as Patent Document 1.

Incidentally, the electric property test is conventionally run on all the chips formed on the wafer, and there is a problem that the test takes a long time. In particular, the number of elements contained in one chip keeps increasing in these days, and for this reason, the test time tends to extend further. Also, the reliability level of each chip is conventionally enhanced by running the wafer B/I test. However, running the wafer B/I test does not necessarily succeed in making all the chips having potential defects defective, and there is a case where a chip having a potential defect is judged erroneously as being a conforming article.

SUMMARY OF THE INVENTION

The invention was devised in view of the foregoing, and therefore has an object to provide an LSI inspection method and a defect inspection data analysis apparatus capable of shortening a time needed for a wafer test.

Also, the invention was devised in view of the foregoing, and therefore has another object to provide an LSI inspection method and a defect inspection data analysis apparatus capable of enhancing the reliability level of each chip.

In order to achieve the above objects, a first aspect of the invention provides an LSI inspection method, comprising: a first step of identifying, after a front-end process is completed, a chip having a defect among all chips formed on a wafer and determining a type of defect for each defect that the identified chip has, on the basis of inspection data obtained by inspecting the wafer for a defect by means of a defect inspection apparatus after processing is performed in each of predetermined process steps among a plurality of process steps in the front-end process; a second step of judging, for each chip identified in said first step, whether the chip is a non-conforming article or not according to non-conforming article judgment criteria corresponding to the type of defect for each defect that the chip has and obtaining position information within a surface of the wafer of a chip judged as being a non-conforming article, the non-conforming article judgment criteria for each predetermined type of defect being pre-set on the basis of design data of the wafer, according to which criteria whether a chip formed on the wafer is a non-conforming article or not is judged; a third step of transmitting the position information within the surface of the wafer of each chip judged as being a non-conforming article in said second step to a test apparatus that tests an electric property of each chip formed on the wafer; and a fourth step of not running a test on a chip identified on the basis of the position information transmitted in said third step and running the test on chips other than the identified chip, by means of said test apparatus.

A second aspect of the invention provides an LSI inspection method according to the first aspect, wherein the non-conforming article judgment criteria for particular types of defects include criteria according to which a defect that causes a malfunction is judged, and criteria according to which a potential defect is judged.

In order to achieve the above objects, a third aspect of the invention provides a defect inspection data analysis apparatus, comprising: a first storage means to store inspection data obtained by inspecting a wafer for a defect by means of a defect inspection apparatus after processing is performed in each of predetermined process steps among a plurality of process steps in a front-end process; a second storage means to store non-conforming article judgment criteria, which are set for each predetermined type of defect on the basis of design data of the wafer, and according to which whether a chip formed on the wafer is a non-conforming article or not is judged; a defective chip identifying means to identify, after the front-end process is completed, a chip having a defect among all chips formed on the wafer and to determine a type of defect for each defect that the identified chip has, on the basis of the inspection data stored in said first storage means; a non-conforming chip judging means to read out, from said second storage means and for each chip identified by said defective chip identifying means, the non-conforming article judgment criteria corresponding to the type of defect for each defect that the chip has, then to judge whether the chip is a non-conforming article or not according to the read out non-conforming article judgment criteria, and to obtain position information within a surface of the wafer of a chip judged as being a non-conforming article; and a third storage means to store the position information within the surface of the wafer of each chip judged as being a non-conforming article by said non-conforming chip judging means.

A fourth aspect of the invention provides a defect inspection data analysis apparatus according to the third aspect, further comprising: a transmission means to transmit the position information stored in said third storage means to a test apparatus that tests an electric property of each chip formed on the wafer.

A fifth aspect of the invention provides a defect inspection data analysis apparatus according to the third or fourth aspect, wherein the non-conforming article judgment criteria for particular types of defects include criteria according to which a defect that causes a malfunction is judged, and criteria according to which a potential defect is judged.

According to the defect inspection data analysis apparatus of the invention, whether each chip formed on the wafer is a conforming or non-conforming article is judged on the basis of the inspection data obtained in the front-end process and the non-conforming article judgment criteria for each predetermined type of defect. Because the state of each layer of the wafer can be recognized in the form of an image with the use of such inspection data, it is possible to identify a faulty point accurately and readily and thereby to judge whether each chip formed on the wafer is a conforming or non-conforming article accurately and swiftly.

Also, the defect inspection data analysis apparatus of the invention transmits the position information within the surface of the wafer of a chip judged as being a non-conforming article by the non-conforming chip judging means to the test apparatus that tests the electric property. Thus, for example, the test apparatus becomes able to identify a chip judged as being a non-conforming article, on the basis of the position information thus transmitted, so that it does not run the test on the identified chip and runs the test only on the chips judged as being conforming articles. This enables the electric property test to be run efficiently, thereby making it possible to shorten a time needed for the test.

Further, in the defect inspection data analysis apparatus of the invention, the non-conforming article judgment criteria for particular types of defects stored in the second storage means include not only the criteria according to which a defect that causes a malfunction is judged, but also the criteria according to which a potential defect is judged. This allows the non-conforming chip judging means to judge a chip having a potential defect as being a non-conforming article for the reason that its reliability level is low, and the reliability level of each chip can be thus enhanced. Moreover, because the wafer B/I test can be omitted in the wafer test, not only can a time needed for the wafer test be shortened, but also the need to apply unnecessary stress to the wafer can be eliminated.

Also, according to the LSI inspection method of the invention, the same functions and advantages as those described above can be achieved.

DESCRIPTION OF THE PREFERRED EMBODIMENTS

Figure 1:
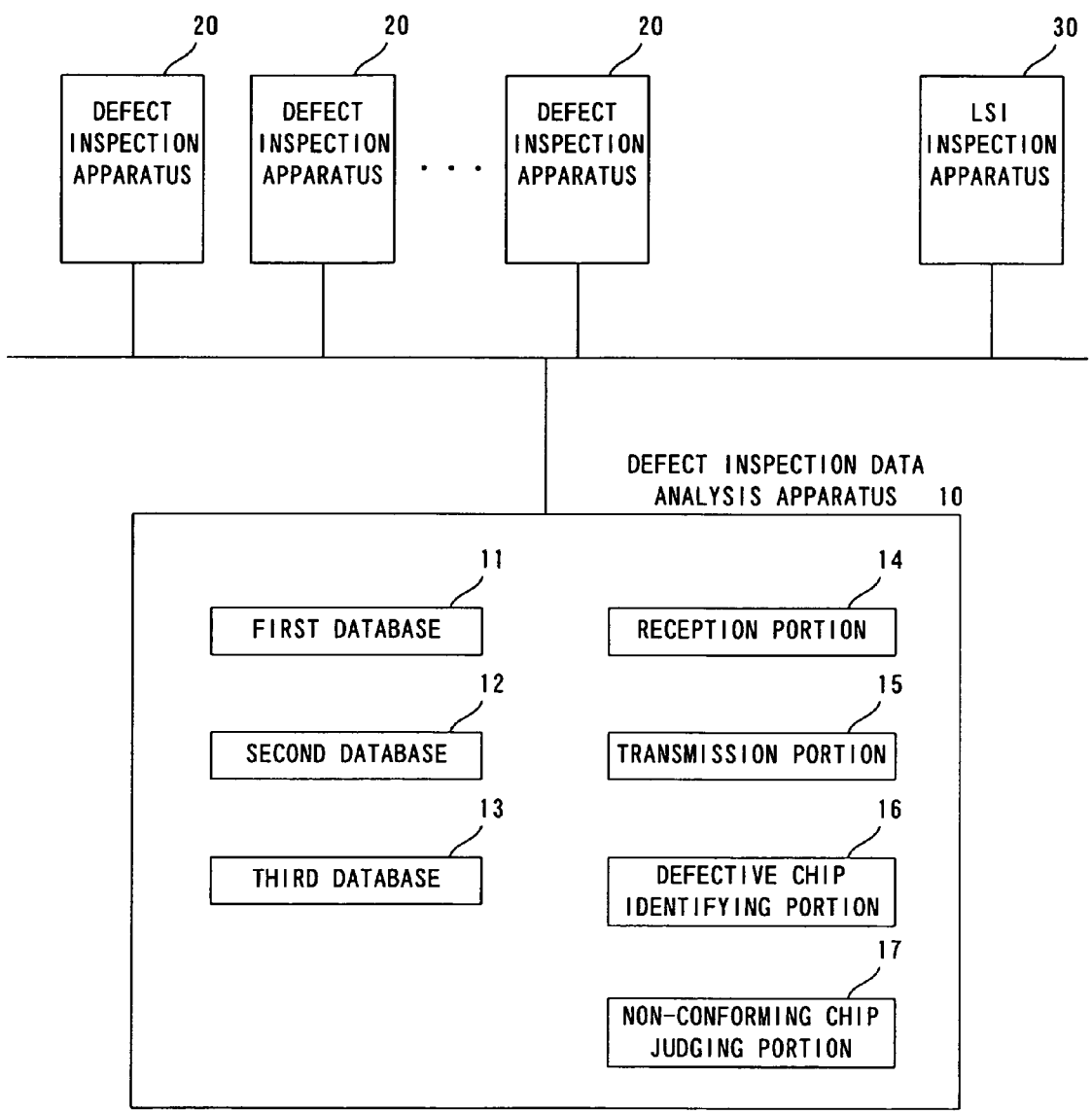
FIG. 1 is a schematic block diagram of a defect inspection data analysis apparatus according to one embodiment of the invention.
Figure 2:
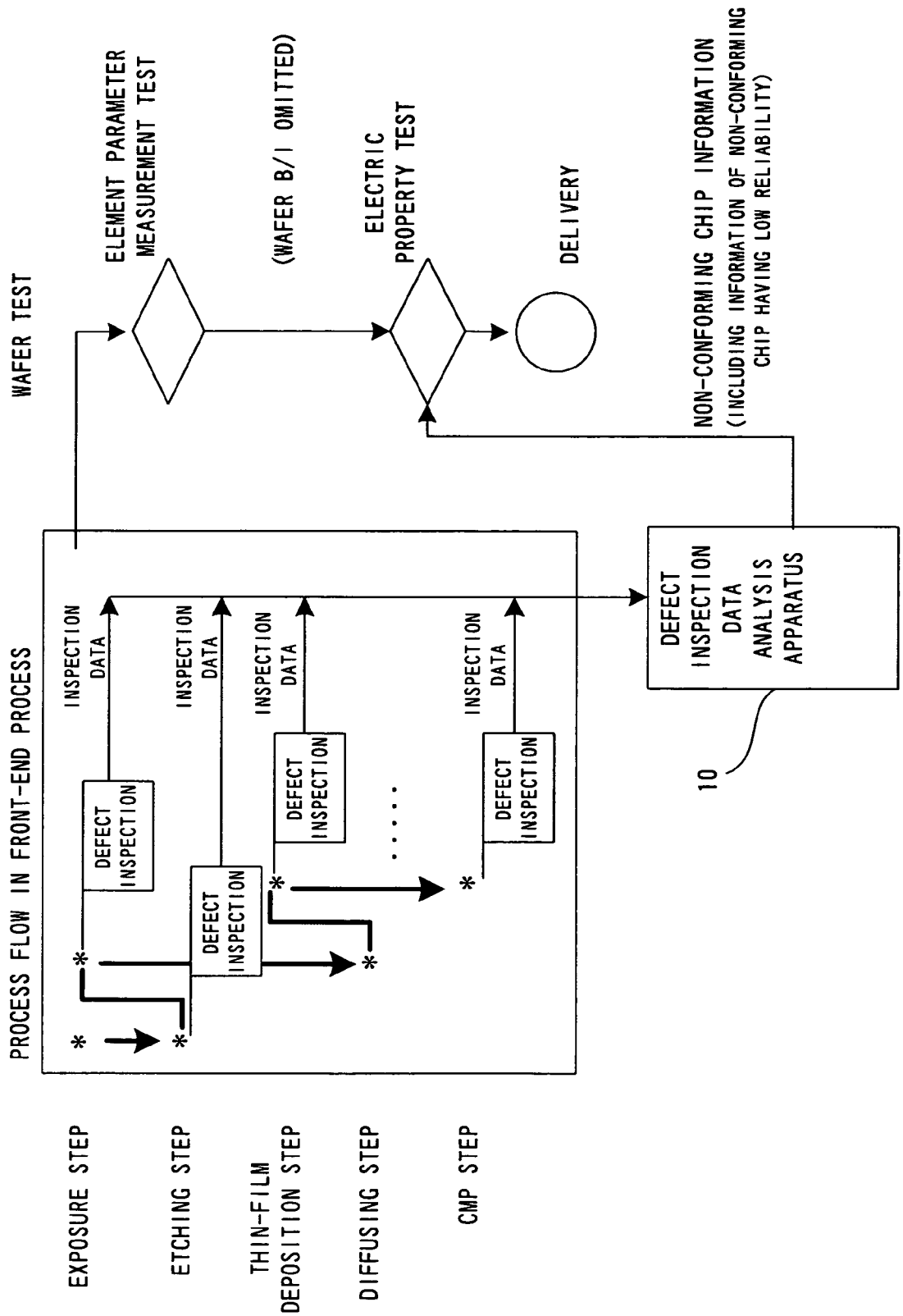
FIG. 2 is a view used to explain a process flow to judge whether each chip formed on a wafer is a conforming or non-conforming article with the use of the defect inspection data analysis apparatus.

One embodiment of the invention will now be described with reference to the accompanying drawings. FIG. 1 is a schematic block diagram of a defect inspection data analysis apparatus according to one embodiment of the invention. FIG. 2 is a view used to explain a process flow to judge whether each chip formed on a wafer is a conforming or non-conforming article with the use of the defect inspection data analysis apparatus.

KGD (Known Good Die) business, by which a wafer is provided to a customer at the stage at which chips have been formed on the wafer with the reliability of each chip being ensured, is being spread. This embodiment also adopts the idea of KGD business, and will discuss a case where a wafer is provided to a customer at the stage at which chips have been formed thereon.

A defect inspection data analysis apparatus 10 of this embodiment judges whether chips, such as large-scale integrated circuits (LSIs), formed on a wafer are conforming or non-conforming articles. As shown in FIG. 1, the defect inspection data analysis apparatus 10 includes a first database 11, a second database 12, a third database 13, a reception portion 14, a transmission portion 15, a defective chip identifying portion 16, and a non-conforming chip judging portion 17. A personal computer may be used as the defect inspection data analysis apparatus 10.

Also, as shown in FIG. 1, the defect inspection data analysis apparatus 10 is connected to a plurality of defect inspection apparatuses 20, 20, . . . and an LSI inspection apparatus 30. This allows data exchange between the defect inspection data analysis apparatus 10 and each defect inspection apparatus 20 or the LSI inspection apparatus 30. To be more specific, the defect inspection data analysis apparatus 10 receives data, such as inspection data, from each defect inspection apparatus 20 via the reception portion 14. Also, the defect inspection data analysis apparatus 10 transmits non-conforming chip information generated in the non-conforming chip judging portion 17 to the LSI inspection apparatus 30 via the transmission portion 15. It should be noted that the LSI inspection apparatus 30 tests the electric property of each chip formed on a wafer.

Each defect inspection apparatus 20 inspects a wafer for defects after processing is performed in each of predetermined process steps among a plurality of process steps in the front-end process. The front-end process means the wafer process steps, that is, each process step involved until chips are formed within a wafer. For example, as shown in FIG. 2, the front-end process includes an exposure step, an etching step, a thin-film deposition step, an impurity diffusing step, a CMP (Chemical Mechanical Polishing) step, etc. In the case of an example of FIG. 2, predetermined processing is performed on a wafer in order of the first exposure step, the etching step, the second exposure step, the impurity diffusing step, the thin-film deposition step, and the CMP step. At this point, a defect inspection is performed on the wafer by a predetermined defect inspection apparatus 20 each time the etching step, the second exposure step, the thin-film deposition step, or the CMP step is completed.

Each defect inspection apparatus 20 inspects a wafer for a foreign substance adhering onto the wafer, a flaw on the wafer surface, a defect in the patterning, etc. As an inspection method in each defect inspection apparatus 20, one of the two following methods is used. A first inspection method is a method of picking up an image of reflection light from the wafer surface and inspecting the wafer for defects on the wafer on the basis of the obtained image. In this case, a chip-to-chip comparison is performed, that is, chips of the same specifications on the same (or different) wafer are compared with each other, and a portion where there is a discrepancy between the two patterns or the like is deemed as a defect. A second inspection method is a method of irradiating the wafer surface with a laser beam scanning, then generating an image representing irregularities on the wafer surface from a laser beam reflected on the wafer surface, and inspecting the wafer for defects on the wafer on the basis of the image thus generated. Which of the two methods should be used is determined depending on the surface condition of a wafer to be inspected. For example, in a case where the surface of a wafer to be inspected has been patterned, it is desirable to use the first inspection method. Contrary to this, in a case where the surface of a wafer to be inspected has not been patterned and is in a condition in which merely aluminum has been sputtered thereon, it is desirable to use the second inspection method. This is because, in the case of the former, a defect can be judged more readily by using an image obtained by picking up an image of reflection light than by using an image obtained from a laser beam, and in the case of the latter, a defect can be judged more readily by using an image obtained from a laser beam than by using an image obtained by picking up an image of reflection light.

Each defect inspection apparatus 20 judges, on the basis of the obtained image, whether semiconductor manufacturing equipment that performs processing in the process steps is operating normally or not. To be more specific, each defect inspection apparatus 20 finds the size of a defect, the position of the defect on the wafer, etc. on the basis of the above-described image, and checks how many defects of a size equal to or larger than a predetermined size are present on the entire wafer surface. When the number of such defects is equal to or greater than a reference value, each defect inspection apparatus 20 sounds an alarm. When such an alarm is sounded, the operator suspends the semiconductor manufacturing equipment immediately before the defect inspection apparatus 20 that sounded the alarm. Then, the operator takes an action, for example, cleans the semiconductor manufacturing equipment to suppress the generation of defects, such as foreign substances, and then resumes the operation of the semiconductor manufacturing equipment.

Incidentally, even when the defect inspection apparatus 20 judges the presence of a defect, the chip having this defect is not necessarily electrically defective. The defect inspection apparatus 20 judges a so-called diagrammatic defect on the image, and there is a case where such a diagrammatic defect is not an electrical defect. For example, a defect cannot be judged immediately as an electrical defect only because a foreign substance is adhering onto a wiring. This is because such adhesion of a foreign substance may not cause an electrical malfunction. A chip is judged as a non-conforming article only when the presence of an electrical defect that makes a normal operation of the chip impossible is judged. In this embodiment, the presence and the absence of such an electrical defect is judged by the non-conforming chip judging portion 17 and the LSI inspection apparatus 30.

Also, each defect inspection apparatus 20 computes an yield impact using data of the inspection result, and judges whether the wafer is a highly reliable product or not. The yield impact referred to herein means a ratio of the number of electrically non-conforming chips with respect to a total number of chips formed on the wafer. The position information on the wafer for each defect is obtained from the inspection by each defect inspection apparatus 20. Also, the position information of each chip formed on the wafer is pre-stored in each defect inspection apparatus 20. For this reason, each defect inspection apparatus 20 is able to compute the number of chips having defects on the basis of the position information on the wafer for each defect and the position information of each chip. Then, the yield impact is computed on the basis of a value found by multiplying the number of chips having defects by a predetermined killer percentage. The killer percentage referred to herein means a percentage of the number of chips that become electrically defective with respect to the number of chips having defects, and is determined on the basis of the results of the inspections in the past by the LSI inspection apparatus 30. Upon judging that the yield impact is equal to or greater than a reference value, each defect inspection apparatus 20 decides to discard the wafer.

The inspection data obtained in each defect inspection apparatus 20 is transmitted to the defect inspection data analysis apparatus 10, and stored into the first database 11. It should be noted that the inspection data includes image data obtained at the time of the inspection by the defect inspection apparatus 20, information as to the size of each defect, the position information on the wafer for each defect, information of the name of the process step immediately before the inspection is performed, etc.

Figure 3:
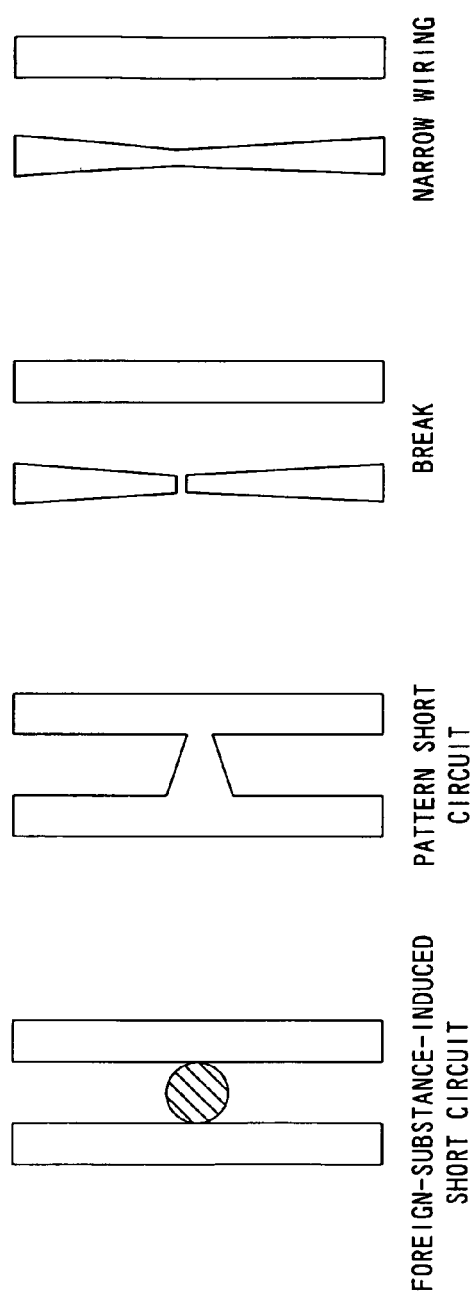
FIG. 3 is a view used to explain types of defects that possibly occur on the wafer.
Figure 3:
Figure 4:
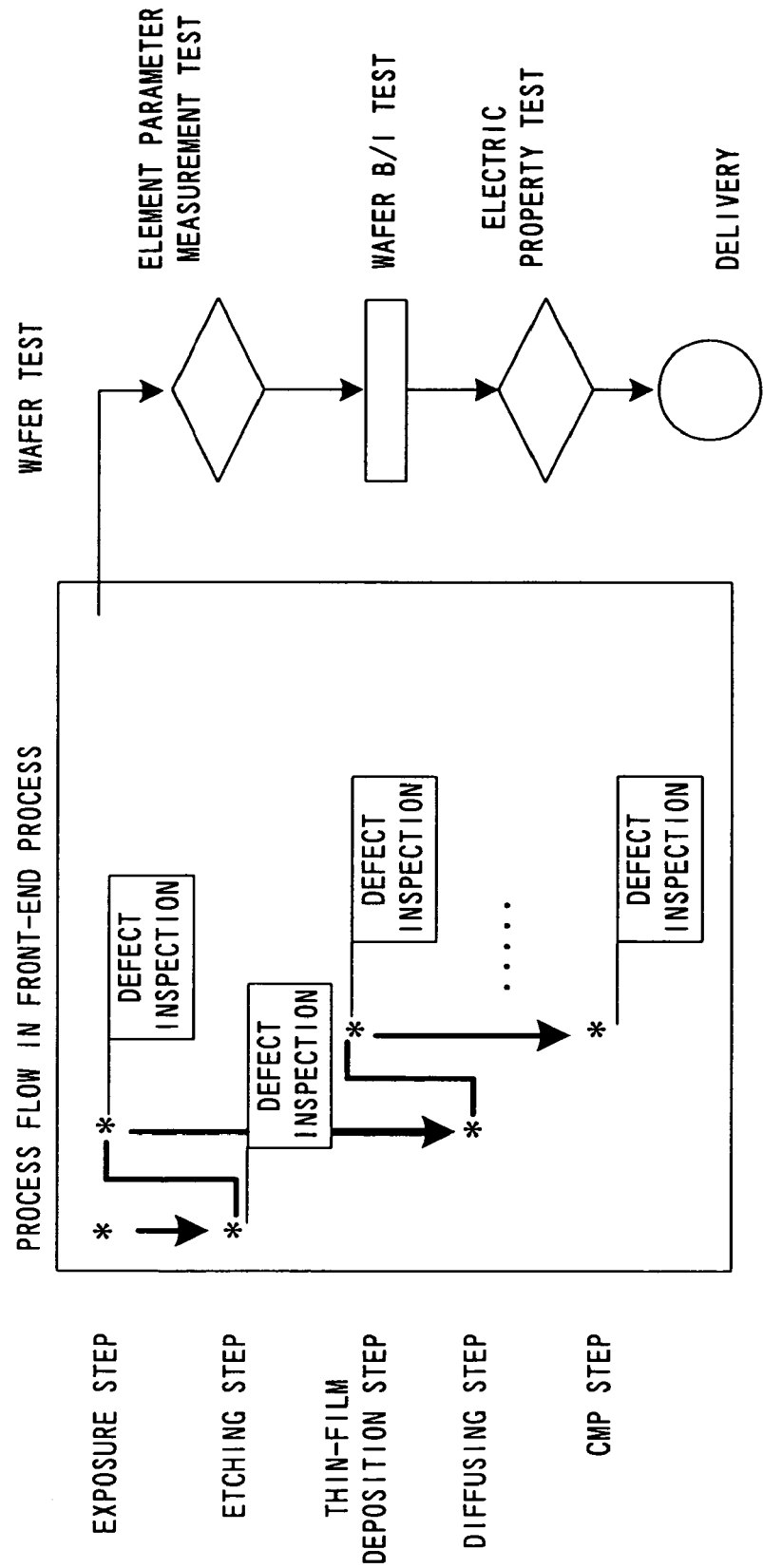
FIG. 4 is a view used to explain the flow of an inspection process by a conventional LSI inspection method.

In the second database 12 are stored non-conforming article judgment criteria set for each predetermined type of defect. In this embodiment, defects that possibly occur on a wafer are classified into eight types. FIG. 3 is a view used to explain the types of defects that possibly occur on a wafer. FIG. 3 shows, as typical defects, eight types of defects: "pattern short circuit", "break", "narrow wiring", "foreign-substance-induced short circuit", "foreign substance on wiring; type A", "foreign substance on wiring; type B", "foreign substance on wiring; type C (contact open)", and "failure in buried contact plug".

"Pattern short circuit" is defined as a defect caused when an extra pattern remains on a wiring and the wiring is short-circuited by the extra pattern. "Break" is defined as a defect caused when the wiring becomes discontinuous, and "narrow wiring" is defined as a defect caused when a wiring is formed narrower than a predetermined width. "Foreign-substance-induced short circuit" is defined as a defect caused when a foreign substance adheres across wirings and the wirings are short-circuited by the foreign substance. "Foreign substance on wiring; type A" is defined as a defect caused when a foreign substance adheres onto a wiring and the distance between the foreign substance and the adjacent wiring is half or more than half the interval between wirings. "Foreign substance on wiring; type B" is defined as a defect caused when a foreign substance adheres onto a wiring and the distance between the foreign substance and the adjacent wiring is greater than 0 and smaller than half the interval between wirings. "Foreign substance on wiring; type C (contact open)" is defined as a defect caused when a foreign substance adheres onto a wiring in the lower layer and a contact to a wiring in the upper layer is not established at the position of the foreign substance. "Failure in buried contact plugs is defined as a defect caused when a contact plug" is not buried within a contact hole.

Some of these defects can be judged immediately as a defect that causes a malfunction of the chip. Such defects are, for example, "foreign substance on wiring; type C (contact open)" and "failure in buried contact plug". Because, with these defects, the wiring in the lower layer and the wiring in the upper layer are not electrically connected due to the presence of a foreign substance or the absence of a buried contact plug. Hence, a chip having these defects is a non-conforming article.

As to the other types of defects, a chip cannot be simply determined as a non-conforming article only because the chip has these defects. For example, in a case where a defect is "foreign substance on wiring; type A", no electrical problem will occur unless there is a need to form a contact on the foreign substance, and therefore, the chip is not a non-conforming article. In a case where a defect is "pattern short circuit" or "foreign-substance-induced short circuit", the chip is not a non-conforming article when the chip is designed in such a manner that the same electrical signal flows through two wirings. On the other hand, the chip is a non-conforming article when the chip is designed in such a manner that different electrical signals flow through these wirings. In a case where a defect is "break", the chip is not a non-conforming article when a wiring having a break is a redundancy line. In a case where a defect is "narrow wiring", the chip is not a non-conforming article when the width of the narrow wiring is within a range allowed by a relation with a current flowing through the wiring. In a case where a defect is "foreign substance on wiring; type B", the chip is not a non-conforming article when the chip is designed in such a manner that the same electrical signal flows through the wiring to which a foreign substance is adhering and the adjacent wiring.

Of all the defects shown in FIG. 3, above all, a defect, such as "narrow wiring" or "foreign substance on wiring; type B", does not cause an electrical malfunction immediately but becomes a factor that lowers the reliability level of the chip. In short, these defects are potential defects. This is because when a product is assembled using a chip having such potential defects, there is a high risk that a failure occurs when the product is used only for a short period of time as a wiring being a narrow wiring causes a break or a foreign substance comes in contact with a wiring.

The non-conforming article judgment criteria for each type of defect are the criteria according to which whether a chip having a defect of each type is a non-conforming article or not is judged. The non-conforming article judgment criteria are pre-set on the basis of the design data of the wafer. Generally, the design data is generated for each layer, and when the non-conforming article judgment criteria are generated, the design data for each layer is referred to. Electrical information can be obtained from the design data. For example, it is possible to obtain information as follows: an electrical malfunction occurs when two specific wirings are linked, a specific wiring is a redundancy line, how wide a specific wiring should be made, etc. Such electrical information is organized for each type of defect, and a case where a chip becomes a non-conforming article (or a conforming article) is represented, for example, by a parameter that characterizes the defect, which corresponds to the non-conforming article judgment criteria.

A concrete example of the non-conforming article judgment criteria will now be described. For example, the non-conforming article judgment criteria for "foreign substance on wiring; type A" include a criterion according to which a chip is a non-conforming article when a foreign substance is adhering onto a wiring at a position at which a contact is made. The non-conforming article judgment criteria for "pattern short circuit" or "foreign-substance-induced short circuit" include a criterion according to which a chip is a non-conforming article when two short-circuited wirings are not the wirings through which the same electric signal is flowed. The non-conforming article judgment criteria for "break" include a criterion according to which a chip is a non-conforming article when a wiring having a break is not a redundancy line. These criteria are the criteria to judge a defect that causes an electrical malfunction.

The non-conforming article judgment criteria for "narrow wiring" include a criterion according to which a chip is a non-conforming article when the width of the wiring is equal to or less than a predetermined reference value. The non-conforming article judgment criteria for "foreign substance on wiring; type B" include a criterion according to which a chip is a non-conforming article when the distance between the foreign substance and the adjacent wiring is equal to or less than a predetermined reference value. These criteria are the criteria to ensure the reliability level of a chip by judging a chip having potential defects as being a non-conforming article. It should be noted that the reference value of the width of the wiring and the reference value of the distance are determined on the basis of the design data.

When the non-conforming article judgment criteria are determined, it is desirable to actually run a test by the LSI inspection apparatus 30 using a sample wafer and confirm the consistency between the test result and the non-conforming article judgment criteria. Also, the foregoing non-conforming article judgment criteria for each type of defect were described by way of example, and generally, the non-conforming article judgment criteria may include a criterion other than those described above. Further, defects may be classified into more than eight types described above. Generally, types of defects are determined arbitrarily by the administrator of the defect inspection data analysis apparatus 10, and the non-conforming article judgment criteria are determined for each type of defect thus determined.

When the front-end process is completed, the defective chip identifying portion 16 identifies a chip having a defect among all the chips formed on the wafer and determines the type of defect for each defect that the identified chip has, on the basis of the inspection data stored in the first database 11. As has been described, the inspection data includes the position information on the wafer for each defect. Also, the position information of the chips on the wafer has been accumulated in the LSI inspection apparatus 30. For this reason, the defective chip identifying portion 16 is able to identify a chip having a defect by examining which of the chips on the wafer contains the defect in question from these two sorts of position information. Also, the type of defect for each defect that the identified chip has can be readily determined on the basis of the image data included in the inspection data. At this point, the defective chip identifying portion 16 computes defect-characterizing parameters for defects of particular types. For example, in a case where a defect is "narrow wiring", the defective chip identifying portion 16 computes the width of the narrow wiring, and in a case where defects are "foreign substance on wiring; type A" and "foreign substance on wiring; type B", the defective chip identifying portion 16 computes the distance between the foreign substance and the adjacent wiring.

For each chip identified by the defective chip identifying portion 16, the non-conforming chip judging portion 17 reads out, from the second database 12, the non-conforming article judgment criteria corresponding to the type of defect for each defect that the chip has, and judges whether the chip is a non-conforming article or not according to the non-conforming article judgment criteria thus read out. To be more specific, for each defect that the identified chip has, the non-conforming chip judging portion 17 checks the inspection data related to the defect and the parameter characterizing the defect against the non-conforming article judgment criteria corresponding to the type of the defect, and judges whether the defect makes the chip defective or not. In a case where at least one of all the defects that the identified chip has is a defect that makes the chip defective according to the non-conforming article judgment criteria, the non-conforming chip judging portion 17 judges the chip as being a non-conforming article. Also, the non-conforming chip judging portion 17 stores the position information within the wafer surface of a chip judged as being a non-conforming article into the third database 13 as non-conforming chip information. It should be noted that because the non-conforming article judgment criteria for particular types of defects include criteria used to judge potential defects, the non-conforming chip information includes not only the information of an electrically non-conforming chip, but also the information of a non-conforming chip having a low reliability level.

When the front-end process is completed, a wafer test is run on the wafer. In this embodiment, an element parameter measurement test and an electric property test are run as the wafer test. The electric property test is a test that tests the electric properties of chips formed on the wafer to judge whether a chip is a conforming or non-conforming article on the basis of the test result, and is run by the LSI inspection apparatus 30. To be more specific, the LSI inspection apparatus 30 activates a predetermined chip by providing the chip with electrical logic data, and judges whether the chip is a conforming or non-conforming article on the basis of a signal outputted from the chip while it is activated.

In this embodiment, the defect inspection data analysis apparatus 10 transmits the non-conforming chip information of the wafer to the LSI inspection apparatus 30 via the transmission portion 15. The LSI inspection apparatus 30 then identifies a chip judged as being a non-conforming article, on the basis of the non-conforming chip information transmitted from the defect inspection data analysis apparatus 10 when it tests the electric properties of chips formed on the wafer, so that it does not run a test on the identified chip. This enables the electric property test to be run only on the conforming chips, thereby making it possible to shorten a time needed for the electric property test.

A processing procedure to judge whether each chip formed on the wafer is a conforming or non-conforming article with the use of the defect inspection data analysis apparatus 10 of this embodiment will now be described.

A wafer is processed in each process step in the front-end process, and a number of chips are formed on the wafer. In the front-end process, each defect inspection apparatus 20 inspects the wafer for defects. The inspection data obtained in each defect inspection data apparatus 20 is transmitted to the defect inspection analysis apparatus 10, and the defect inspection data analysis apparatus 10 stores the inspection data into the first database 11.

When the front-end process is completed, the defective chip identifying portion 16 in the defect inspection data analysis apparatus 10 identifies a chip having a defect among all the chips formed on the wafer and determines the type of defect for each defect that the identified chip has, on the basis of the inspection data stored in the first database 11. At this point, for the defects of particular types, the defective chip identifying portion 16 computes parameters that characterize these defects.

Then, for each chip identified by the defective chip identifying portion 16, the non-conforming chip judging portion 17 reads out, from the second database 12, the non-conforming article judgment criteria corresponding to the type of defect for each defect that the chip has. The non-conforming chip judging portion 17 then judges whether the chip is a non-conforming article or not according to the non-conforming article judgment criteria thus read out. To be more specific, the non-conforming chip judging portion 17 judges the chip as being a non-conforming article when at least one of all the defects that the chip has is a defect that makes the chip defective according to the non-conforming article judgment criteria. Subsequently, the non-conforming chip judging portion 17 stores the position information within the wafer surface of a chip judged as being a non-conforming article into the third database 13 as the non-conforming chip information.

Then, a wafer test is run on the wafer. As shown in FIG. 2, the element parameter measurement test is run first. To be more specific, in the element parameter measurement test, the basic parameters of the elements are measured to check whether the transistor has desired properties, whether the resistor has a desired resistance value, etc. The element parameter measurement test is not run on all the elements. For example, several elements are selected from a clearance (scribe region) between particular chips, and the element parameter measurement test is run only on the selected elements. This is because the purpose of this test is not to check conforming and non-conforming articles, but to confirm whether an element having desired properties has been formed.

Subsequently, the electric property test is run by the LSI inspection apparatus 30. At this point, the defect inspection data analysis apparatus 10 transfers the non-conforming chip information of the wafer to the LSI inspection apparatus 30 via the transmission portion 15. When transferring the non-conforming chip information, the defect inspection data analysis apparatus 10 converts the non-conforming chip information into a data format recognizable by the LSI inspection apparatus 30, and transmits the converted data to the LSI inspection apparatus 30. To be more specific, the defect inspection data analysis apparatus 10 converts the non-conforming chip information to binary data or data in the ASC format. The LSI inspection apparatus 30 then identifies a chip judged as being a non-conforming article, on the basis of the non-conforming chip information transmitted from the defect inspection data analysis apparatus 10, so that it does not run the electric property test on the identified chips and runs the electric property test only on the conforming chips.

When the wafer test is completed in this manner, the wafer is delivered together with a wafer map indicating the judging result as to whether each chip is a conforming or non-conforming article.

The defect inspection data analysis apparatus of this embodiment judges whether each chip formed on the wafer is a conforming or non-conforming article on the basis of the inspection data obtained in the front-end process and the non-conforming article judgment criteria for each predetermined type of defect. Incidentally, a faultiness detected by running the electric property test with the use of the LSI inspection apparatus, after all, results from defects shown in FIG. 3. The electric property test cannot directly identify a faulty point present inside. Because logic data of various patterns are needed to identify the faulty point, it is quite difficult to identify the faulty point and to analyze the cause in the portion thereof. Contrary to this, the defect inspection data analysis apparatus of this embodiment is able to recognize the state of each layer of the wafer in the form of an image with the use of the inspection data obtained in each defect inspection apparatus. Hence, because the faulty point can be identified accurately and readily, it is possible to judge whether each chip formed on the wafer is a conforming or non-conforming article accurately and swiftly. As has been described, in this embodiment, the inspection data obtained in each defect inspection apparatus is not used in the front-end process alone; the inspection data is also used efficiently when whether each chip is a conforming or non-conforming article is judged after the front-end process is completed.

Also, the defect inspection data analysis apparatus of this embodiment transmits the non-conforming chip information to the LSI inspection apparatus. As has been described, the non-conforming chip information includes information of a non-conforming chip so judged accurately by the non-conforming chip judging portion. Thus, for example, the LSI inspection apparatus can identify a chip judged as being a non-conforming article, on the basis of the non-conforming chip information, so that it does not run the electric property test on the identified chip and runs the electric property test only on the chips judged as being conforming articles. This enables the electric property test to be run efficiently, thereby making it possible to shorten a time needed for the test.

By taking it into account that the defect inspection data analysis apparatus of this embodiment can judge accurately whether each chip formed on the wafer is a conforming or non-conforming article, the LSI inspection apparatus may run the electric property test in a simpler manner. This is because a chip judged as being a conforming article by the defect inspection data analysis apparatus has been manufactured according to the design, and it is thought to have no electrical problem. For example, the electric property test may be run on several chips selected from the chips judged as being conforming articles, or alternatively the electric property test may be run on a wafer drawn from one lot. Further, the electric property test by the LSI inspection apparatus may be omitted in some cases.

Further, in the defect inspection data analysis apparatus of this embodiment, the non-conforming article judgment criteria for particular types of defects stored in the second database include not only the criteria according to which a defect that causes a malfunction is judged, but also the criteria according to which a potential defect is judged. This allows the non-conforming chip judging portion to judge a chip having a potential defect also as being a non-conforming article for the reason that its reliability level is low. Moreover, because the non-conforming chip judging portion can make such a judgment accurately, the reliability level of each chip can be enhanced. As has been described, the defect inspection data analysis apparatus of this embodiment can ensure the reliability level of each chip, and for this reason, the wafer B/I test in the wafer test can be omitted. This is the reason why the wafer B/I test is omitted from the procedure flow of FIG. 2. Judging from this point also, a time needed for the wafer test can be shortened with the use of the defect inspection data analysis apparatus of this embodiment. Also, there is a merit that the need to apply unnecessary stress to the wafer is eliminated by omitting the wafer B/I test. As has been described, the defect inspection data analysis apparatus of this embodiment is particularly suitable for use in KGD business.

Incidentally, inspection omissions in a system LSI have been increasing recently. This is because the system LSI has been increasing in size and has been furnished with too many functions, so that it is difficult to test all these functions in terms of costs. However, by inspecting the system LSI with the use of the defect inspection data analysis apparatus of this embodiment, it is possible to judge whether each chip is a conforming or non-conforming article accurately and swiftly. Hence, the above-described problem of inspection omissions can be prevented even when the electric property test is not performed by the LSI inspection apparatus.

It should be appreciated that the invention is not limited to the embodiment above, and can be modified in various manners within the scope of the invention.

What is claimed is:

1. A defect inspection data analysis apparatus, comprising:
   a first storage means to store inspection data obtained by inspecting a wafer for a defect by means of a defect inspection apparatus after processing is performed in each of predetermined process steps among a plurality of process steps in a front-end process;
   a second storage means to store non-conforming article judgment criteria, which are set for each predetermined type of defect on the basis of design data of the wafer, and according to which whether a chip formed on the wafer is a non-conforming article or not is judged;
   a defective chip identifying means to identify, after the front-end process is completed, a chip having a defect among all chips formed on the wafer and to determine a type of defect for each defect that the identified chip has, on the basis of the inspection data stored in said first storage means;
   a non-conforming chip judging means to read out, from said second storage means and for each chip identified by said defective chip identifying means, the non-conforming article judgment criteria corresponding to the type of defect for each defect that the chip has, then to judge whether the chip is a non-conforming article or not according to the read out non-conforming article judgment criteria, and to obtain position information within a surface of the wafer of a chip judged as being a non-conforming article; and
   a third storage means to store the position information within the surface of the wafer of each chip judged as being a non-conforming article by said non-conforming chip judging means.

2. The defect inspection data analysis apparatus according to claim 1, further comprising:
   a transmission means to transmit the position information stored in said third storage means to a test apparatus that tests an electric property of each chip formed on the wafer.

3. The defect inspection data analysis apparatus according to claim 1 or 2, wherein the non-conforming article judgment criteria for particular types of defects include criteria according to which a defect that causes a malfunction is judged, and criteria according to which a potential defect is judged.

* * * * *